United States Patent [19]

Onoye

[11] Patent Number: 4,464,968
[45] Date of Patent: Aug. 14, 1984

[54] SYSTEM FOR STORING AND READING OUT MUSICAL TONE SIGNALS

[75] Inventor: Hideo Onoye, Yamato, Japan

[73] Assignee: Victor Company of Japan, Ltd., Japan

[21] Appl. No.: 498,161

[22] Filed: May 25, 1983

[30] Foreign Application Priority Data

Jun. 3, 1982 [JP] Japan .................................. 57-95371

[51] Int. Cl.³ .............................................. G10H 3/03
[52] U.S. Cl. .................................................... 84/1.28
[58] Field of Search ................................ 84/1.01, 1.28

[56] References Cited

U.S. PATENT DOCUMENTS 4,185,531 1/1980 Oberheim et al. ............... 84/1.28 X Primary Examiner—Stanley J. Witkowski
Attorney, Agent, or Firm—Andrus, Sceales, Starke & Sawall

[57] ABSTRACT

A system stores and reads out a musical tone signal. The system comprises a circuit for supplying an input musical tone signal having a frequency versus level characteristic which varies with time, a generator for generating a control signal which undergoes level variation in correspondence with the variation in the characteristic of the input musical tone signal during a storing mode, a circuit supplied with the control signal for producing a frequency signal which varies its frequency according to the level of the control signal, an A/D converter for sampling the input musical tone signal according to the above frequency signal and converting the input musical tone signal into a digital signal, a voltage supplying circuit for supplying a voltage to the generator during a read-out mode, a memory into which the output digital signal of the A/D converter is stored according to the frequency signal during the storing mode and from which the stored digital signal is read out according to the frequency signal during the read-out mode, a D/A converter for converting the digital signal read out from the memory into an analog signal according to the above frequency signal, and a circuit for obtaining the output of the D/A converter as a reproduced musical tone signal. The generator generates the control signal of which frequency lowers with lapse of time.

14 Claims, 9 Drawing Figures

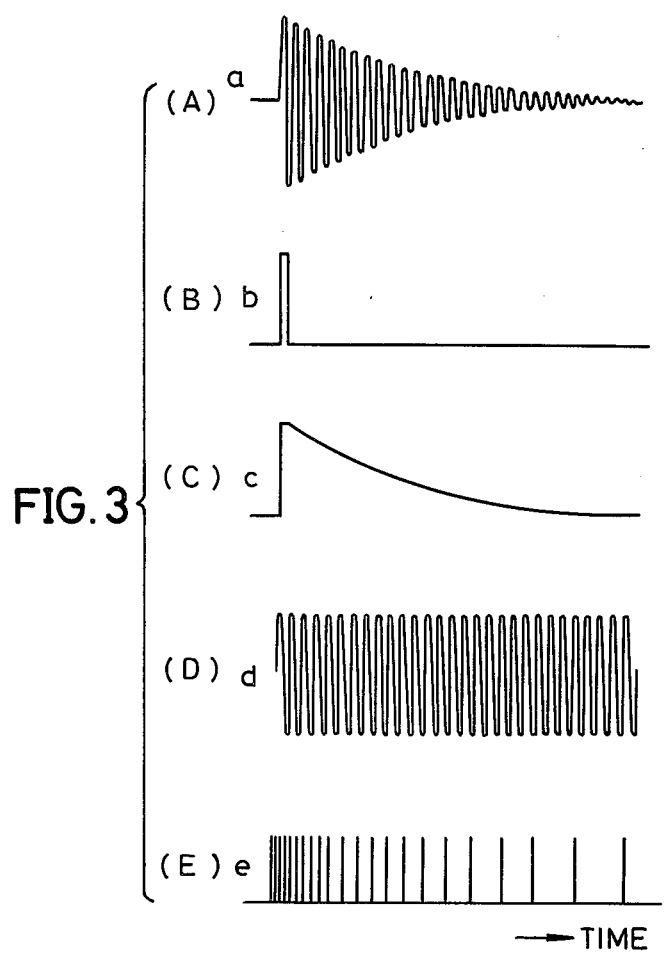

SYSTEM FOR STORING AND READING OUT MUSICAL TONE SIGNALS

BACKGROUND OF THE INVENTION

The present invention generally relates to systems for storing and reading out musical tone signals, and more particularly to a system for storing (recording) a musical tone signal which is produced by a musical instrument into a memory and reading out (reproducing) the stored musical tone signal to generate a musical tone.

As one tyoe of electronic musical instrument, an apparatus was devised in which a musical tone signal produced by a musical instrument such as piano, guitar, and percussion instrument, is stored in a memory, and the stored musical tone signal is reproduced upon playing of the electronic musical instrument. According to such an electronic musical instrument, a musical tone exceedingly similar to the musical tone produced by the actual musical instrument is reproduced upon playing of the electronic music instrument. Each of the sounds in the musical scale of the actual musical instrument are respectively stored in corresponding memories by the manufacturer of the electronic musical instrument. When the player of the electronic musical instrument presses a key of a keyboard, for example, a musical tone signal is read out from a corresponding memory and reproduced as a musical tone. According to this type of an electronic musical instrument, the reproduced sounds are exceedingly similar to those of the actual musical instrument, when compared to conventional electronic musical instruments which produce synthesized sounds.

When storing the musical tone signal of the actual musical instrument, the musical tone signal is sampled and converted into a digital signal. In order to truely reproduce the musical tone signal, it is necessary to sample the musical tone signal at a frequency which is twice the maximum frequency included within the musical tone signal. However, the sound (musical tone) produced by the musical instrument does not only include the fundamental wave, but also includes high orders of harmonics of the fundamental wave. Thus, the maximum frequency of the frequency components included within one musical tone is exceedingly high compared to its fundamental frequency. Moreover, the musical tone is not an instantaneous sound, and is a sound which assumes a high level at the instant when the musical tone is produced and gradually becomes attenuated with time.

Accordingly, if the sampling is to be performed not only with respect to the fundamental wave frequency, but also including the high order harmonic frequencies, the sampling must be performed at twice the maximum frequency. Further, such sampling must be continued even while the sound level becomes attenuated under a certain level. As a result, the memory for storing the musical tone signal sampled in the above described manner required a considerably large memory capacity, and there was a disadvantage in that the manufacturing cost of the electronic musical instrument became high.

As will be described hereinafter, the musical tone becomes attenuated from the instant when the musical tone is produced, however, the attenuation rate is not the same for the low frequency range (fundamental wave) component and the high frequency range (harmonic) components. That is, the low frequency range component gradually becomes attenuated within a long period of time, but on the other hand, the high frequency range components become attenuated within a short period of time. The attenuation time becomes shorter as the frequency becomes higher. Hence, when storing the sampled musical tone signal into the memory, the present inventor noted that it was meaningless to continue the sampling at a high sampling frequency which was set by taking into account the maximum frequency component obtained immediately after the musical tone is produced, after a certain time period has elapsed from the instant when the musical tone was produced and the high frequency range components have been rapidly attenuated.

SUMMARY OF THE INVENTION

Accordingly, it is a general object of the present invention to provide a novel and useful system for storing and reading out musical tone signals, in which the above described disadvantages have been overcome.

Another and more specific object of the present invention is to provide a system for storing and reading out a musical tone signal, in which the storing and read-out of the musical tone signal are carried out by sampling the musical tone signal at a high sampling frequency when the musical tone signal includes high frequency range components immediately after the musical tone is produced, and reducing the sampling frequency as the high frequency range components rapidly become attenuated with time compared to the low frequency range component after the tone signal is produced. According to the system of the present invention, when compared to a case where the sampling of the produced musical tone signal is continued at the same high sampling frequency after the musical tone signal is produced, the memory capacity of the memory for storing the sampled musical tone signal may be reduced, and the manufacturing cost of the system may be reduced.

Other objects and further features of the present invention will be apparent from the following detailed description when read in conjunction with the accompanying drawings.

BRIEF DESCRIPTION OF THE DRAWINGS

FIGS. 3(A) through 3(E) are graphs respectively showing signal waveforms at each part of the block system shown in FIG. 2A.

DETAILED DESCRIPTION

Figure 1:
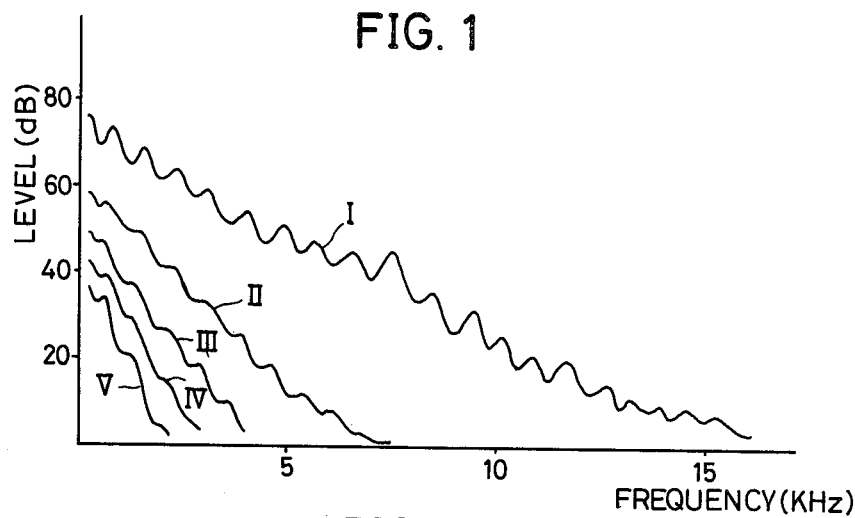
FIG. 1 is a graph showing changes in frequency characteristics of a musical tone with respect to time.

Generally, a musical tone produced from a musical instrument such as a piano, for example, comprises a fundamental wave frequency (low frequency range) component and its harmonic (high frequency range) components at an instant when the musical tone is produced as indicated by a curve I in FIG. 1, and the existing high frequency range components also have relatively large levels. In FIG. 1, the horizontal axis represents the frequency, and the vertical axis represents the level. However, the frequency versus level characteristics of the produced musical tone signal after one second, two second, three seconds, and four seconds have elapsed from the instant when the musical tone is produced, respectively become as indicated by curves II, III, IV, and V in FIG. 1. As may be seen from the characteristics shown in FIG. 1, the rate at which the high frequency range components are attenuated from the instant when the musical tone is produced, is higher than the rate at which the low frequency range component becomes attenuated, and the attenuation rate is substantially higher as the frequency becomes higher. The present invention utilizes this relationship between the attenuation rate and the frequency.

Description will now be given with respect to an embodiment of a storing system of the system according to the present invention by referring to FIG. 2A. A musical tone signal a shown in FIG. 3(A) is obtained by picking up a musical tone of a musical instrument such as a piano, for example, by use of a microphone (not shown). This musical tone signal a is applied to an input terminal 11, and supplied to a variable attenuator 12 and a rising-up detecting circuit 16a. An envelope of the entire musical tone signal a comprising the fundamental component and the harmonic components, becomes attenuated with time as shown in FIG. 3(A), and the harmonic components within the musical tone signal become attenuated rapidly.

The rising-up detecting circuit 16a detects a rising-up of the musical tone signal a, and produces a detection signal b shown in FIG. 3(B). This detection signal b is supplied to a control signal generating circuit 17a which produces a control signal c having a waveform shown in FIG. 3(C) according to the detection signal b. The control signal generating circuit 17a comprises an integrating circuit, for example, and its rising-up time constant is set exceedingly small while its attenuating time constant is set large. Accordingly, the control signal c has a waveform which rises up instantaneously and thereafter becomes attenuated exponentially. The above attenuating time constant is selected so that the control signal c assumes an attenuating waveform in correspondence with the attenuation of the high frequency range components of the musical tone signal.

The output control signal c of the control signal generating circuit 17a is supplied to a voltage-to-frequency (V/F) converter 18a wherein the control signal c is converted into a signal e shown in FIG. 3(E) having a frequency in accordance with the voltage of the control signal c. The frequency of the signal e becomes higher as the voltage of the control signal c becomes higher, and vice versa.

On the other hand, the musical tone signal a obtained through the input terminal 11 is also supplied to the variable attenuator 12. The variable attenuator 12 comprises a variable gain amplifying circuit, for example, and is varied of its gain when applied with the control signal c from the control signal generating circuit 17a. Thus, the musical tone signal a shown in FIG. 3(A) having the gradually decreasing envelope, is formed into a musical tone signal d shown in FIG. 3(D) having a substantially constant envelope in the variable attenuator 12. The reason why the variable attenuator 12 is employed is because, if the musical tone signal a remains unchanged, quantization noise will be introduced at parts of the musical tone signal a where the level is attenuated, that is, where the amplitude is small, when quantizing the musical tone signal a. In other words, the variable attenuator 12 is provided in order to enable satisfactory quantization at the parts of the musical tone signal a where the level is attenuated.

The output signal d of the variable attenuator 12 is supplied to a variable lowpass filter 13a wherein unwanted signal components are eliminated. The variable lowpass filter 13a is varied of its filtering band when applied with the output control signal c of the control signal generating circuit 17a. The cutoff frequency in the filtering band of the variable lowpass filter 13a is high when the level of the control signal c is high, and the variable lowpass filter 13a operates in such a manner that the cutoff frequency of its filtering band becomes lower as the level of the control signal c becomes lower. The high frequency range components of the musical tone signal will be attenuated rapidly with time even if the musical tone signal is not passed through the variable lowpass filter 13a. However, it is preferable to pass the musical tone signal through the variable lowpass filter 13a in order to eliminate the unwanted signal components. If the cutoff frequency of the variable lowpass filter 13a which is a function of a level (l) of the control signal c is represented by $f_c(l)$, and the frequency of the output signal e of the V/F converter 18a which is also a function of the level (l) of the control signal c by $f_s(l)$, the cutoff frequency $f_c(l)$ of the variable lowpass filter 13a and the output signal frequency $f_s(l)$ of the V/F converter 18a are selected to satisfy a relation $2f_c(l) < f_s(l)$.

The output of the variable lowpass filter 13a is supplied to an analog-to-digital (A/D) converter 14 wherein the signal is sampled at the frequency of the output signal e of the V/F converter 18a and converted into a digital signal. Because the frequency of the signal e is high at the beginning thereof and gradually decreases as described before, the sampling in the A/D converter 14 is carried out at a high frequency with respect to the musical tone signal in its initial state including many high frequency range components. On the other hand, as the high frequency range components of the musical tone signal rapidly become attenuated thereafter, the sampling is carried out in the A/D converter 14 at a low frequency with respect to the low frequency range component. The maximum frequency of the musical tone signal which is sampled in the A/D converter 14 is substantially equal to the cutoff frequency of the variable lowpass filter 13a, and moreover, the repetition frequency of the pulse which carries out the sampling satisfies the relation set forth in the preceding paragraph. Therefore, a distortion due to aliasing noise will not be introduced when the sampling is carried out in the A/D converter 14.

The output signal of the A/D converter 14 is supplied to a memory 15, and stored into the memory 15 according to the signal e supplied to the memory 15 from the V/F converter 18a. The digital musical tone signal which is stored into the memory 15, is a signal obtained by carrying out the sampling at a low sampling frequency with respect to a signal part where the high frequency range components are attenuated. Thus, compared to a digital musical tone signal which is obtained by carrying out the sampling uniformly at a high sampling frequency also with respect to such signal part where the high frequency range components are attenuated, the musical tone signal obtained from the A/D converter 14 may be stored within the memory 15 occupying less memory space. That is, the memory capacity of the memory 15 may be reduced.

A plurality of memories are provided, and the sounds in each of the musical scales of the musical instrument are stored into each of the memories in the manner described above. The memories which are stored in this manner, are removed from the storing system shown in FIG. 2A, and the electronic musical instrument is manufactured by assembling these memories therein. In the present embodiment, the memory 15 comprises a read only memory (ROM).

Next, description will be given with respect to a read-out system of the electronic musical instrument shown in FIG. 2B, which reads out the digital musical tone signals stored in the memories which are assembled within the electronic musical instrument. In FIG. 2B, those parts which correspond to the blocks in the storing system shown in FIG. 2A are designated by the same reference numerals with a subscript "b" instead of the subscripts "a" added to the blocks of the storing system shown in FIG. 2A.

When reading out a stored digital musical tone signal from the memory 15, a key (not shown) corresponding to that stored sound is pressed to close a normally open switch 22. When the switch 22 is closed, a voltage +V from a voltage source terminal 21 is applied to a rising-up detecting circuit 16b, and the rising-up detecting circuit 16b produces a signal similar to the signal b described before. This signal produced by the rising-up detecting circuit 16b is supplied to a control signal generating circuit 17b, and a control signal similar to the control signal c shown in FIG. 3(C) is generated from the control signal generating circuit 17b. This control signal from the control signal generator 17b is supplied to a V/F converter 18b, and the V/F converter 18b produces a signal which undergoes the same frequency change as the signal e shown in FIG. 3(E).

The output signal of the V/F converter 18b is applied to the memory 15, and the stored digital musical tone signal is read out from the memory 15 in the same sequence as that upon storing of the digital musical tone signal. The digital musical tone signal thus read out from the memory 15, is supplied to a digital-to-analog (D/A) converter 23 wherein the signal is converted into an analog signal according to the output signal of the V/F converter 18. The output signal of the D/A converter 23 is passed through a variable lowpass filter 13b having a cutoff frequency which varies when applied with the control signal from the control signal generating circuit 17b. The signal thus passed through the variable lowpass filter 13b is supplied to a variable attenuator 24. The step-shaped analog output signal of the D/A converter 23 which is supplied to the lowpass filter 13b, is eliminated of its unwanted frequency components in the variable lowpass filter 13b, and is formed into a signal having a smooth sinusoidal waveform. As in the case of the storing system shown in FIG. 2A, the cutoff frequency of the variable lowpass filter 13b is less than ½ the maximum repetition frequency of the signal produced from the V/F converter 18b.

The analog signal supplied to the variable attenuator 24 from the variable lowpass filter 13b, has an envelope similar to that of the signal d shown in FIG. 3(D). The variable attenuator 24 carries out attenuation with a characteristic complementary to that of the amplification carries out by the variable attenuator 12 of the storing system, according to the control signal from the control signal generating circuit 17b. Accordingly, a reproduced musical tone signal having an envelope similar to that of the input musical tone signal a shown in FIG. 3(A), is produced from the variable attenuator 24. This reproduced musical tone signal is obtained through an output terminal 25, and reproduced as a musical tone by a speaker (not shown).

As described before, the electronic musical instrument having the read-out system shown in FIG. 2B can be manufactured at low cost, because the memory capacity of the memory 15 may be small.

In the embodiment described heretofore, the musical tone signal which is to be stored in the memory 15 is assumed to be a signal corresponding to a musical tone of the piano. However, the musical tone signal to be stored is not limited to the signal corresponding to the musical tone of the piano, and may be a signal of other musical tones. The sampling frequency of the A/D converter 14 should be varied according to the change in the frequency versus level characteristic of the musical tone as time elapses.

Figure 2A:
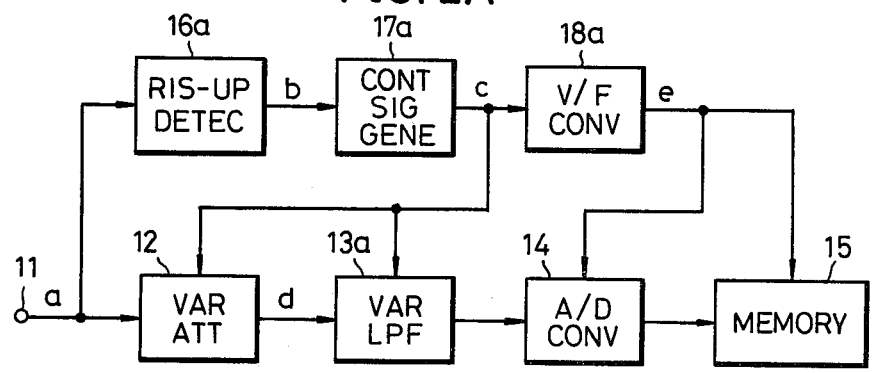
FIGS. 2A and 2B are systematic block diagrams respectively showing an embodiment of a storing system and a read-out system of the system for storing and reading out musical tone signals according to the present invention.
Figure 2B:
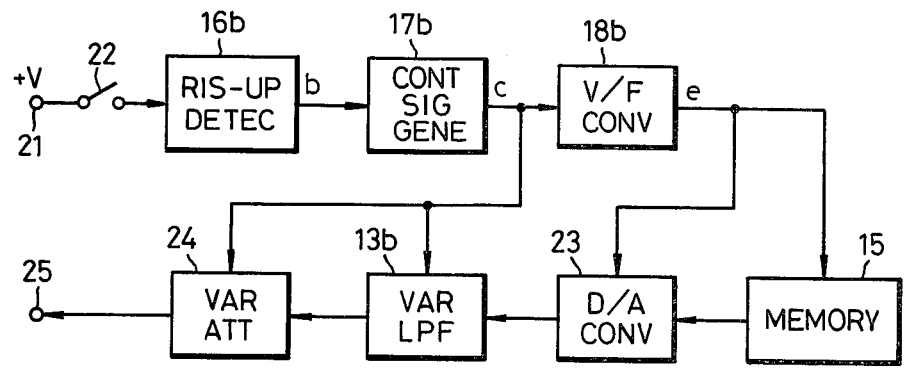
Figure 4:
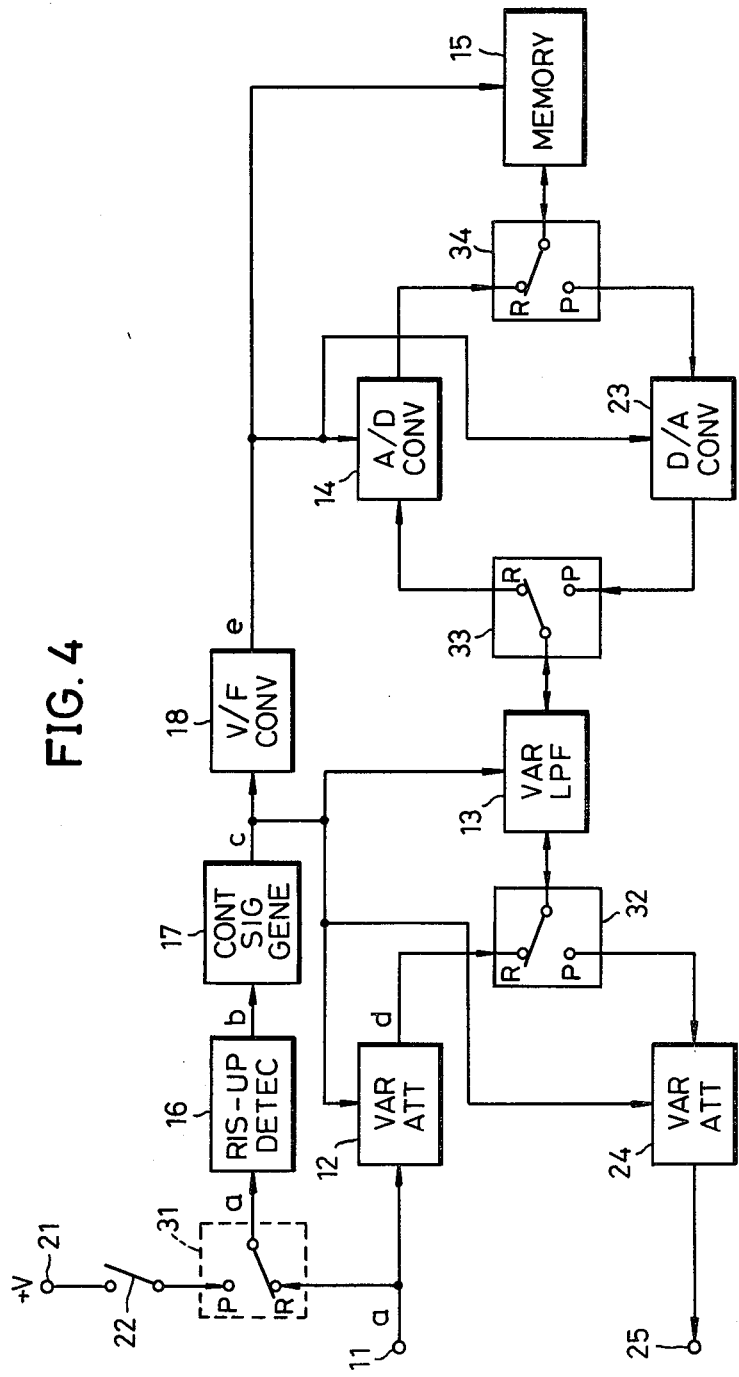
FIG. 4 is a systematic block diagram showing another embodiment of a system according to the present invention.

Next, an embodiment wherein the storing system shown in FIG. 2A and the read-out system shown in FIG. 2B are assembled into an electronic musical instrument device, is shown in FIG. 4. In FIG. 4, those parts which are the same as those corresponding parts in FIGS. 2A and 2B are designated by the same reference numerals, those parts which correspond to the blocks in FIGS. 2A and 2B are designated by the same reference numerals with the subscript deleted, and the operation thereof will be omitted.

During a storing (recording) mode, moving contacts of switches 31 through 34 are connected to respective contacts R. Accordingly, during the storing mode, the musical tone signal obtained through the input terminal 11 is supplied to the variable attenuator 12. This musical tone signal obtained through the input terminal 11 is also supplied to the rising-up detecting circuit 16 through the switch 31. The output of the variable attenuator 12 is supplied to the variable lowpass filter 13 through the switch 32. The output control signal of the control signal generating circuit 17 is simultaneously applied to the variable attenuators 12 and 24 and the variable lowpass filter 13. However, during the storing mode, no signal is supplied to the variable attenuator 24 through the switch 32, and the variable attenuator 24 does not operate.

The output of the variable lowpass filter 13 is supplied to the A/D converter 14 through the switch 33, and converted into the digital signal according to the output signal frequency of the V/F converter 18. The output of the V/F converter 18 is simultaneously applied to the A/D converter 14 and the D/A converter 23, however, no signal is supplied to the D/A converter 23 through the switch 34 during the storing mode. Thus, the D/A converter 23 does not operate during the storing mode. The output of the A/D converter 34 is supplied to the memory 15 through the switch 34, and stored into the memory 15 according to the output signal frequency of the V/F converter 18.

During a read-out mode, the moving contacts of the switches 31 through 34 are connected to respective contacts P. When the key switch 22 is closed, a predetermined voltage is supplied to the rising-up detecting circuit 16 through the switch 31. The digital signal which is read out from the memory 15 according to the output signal frequency of the V/F converter 18, is supplied to the D/A converter 23 through the switch 34. Accordingly, the digital signal read out from the memory 15 is converted into the analog signal in the D/A converter 23, according to the output signal frequency of the V/F converter 18. The output signal of the D/A converter 23 is supplied to the variable lowpass filter 13 through the switch 33. The output signal of the variable lowpass filter 13 is supplied to the variable attenuator 24 through the switch 32, and the output signal of the variable attenuator 24 is obtained through the output terminal 25. During the read-out mode, the variable attenuator 12 is applied with the control signal from the control signal generating circuit 17. However, because no input signal is supplied to the variable attenuator 12 through the input terminal 11, the variable attenuator 12 does not operate during the read-out mode. Similarly, the A/D converter 14 is applied with the output signal of the V/F converter 18 during the read-out mode, however, the A/D converter 14 does not operate during the read-out mode because no signal is applied thereto through the switch 33.

In the case of the embodiment shown in FIGS. 2A and 2B, the read only memory (ROM) is used for the memory 15, however, in the embodiment shown in FIG. 4, a random access memory (RAM) is used for the memory 15.

In the embodiments described heretofore, each of the blocks themselves in the systems may be realized by known circuits. For example, a dual gate gain control circuit NE570/571 manufactured by SIGNETICS of the United States which may be used as compressor and expander, can be used for the variable attenuators 12 and 24. Further, a voltage controlled variable filter 2044 manufactured by SOLID STATE MUSIC of the United States can be used for the variable lowpass filters 13a, 13b, and 13. Moreover, a voltage controlled oscillator 8038 manufactured by DATEL-INTERSIL of the United States can be used for the V/F converters 18a, 18b, and 18.

Further, the present invention is not limited to these embodiments, but various variations and modifications may be made without departing from the scope of the present invention.

What is claimed is:

1. A storing system for a musical tone signal comprising:
   supplying means for supplying an input musical tone signal having a frequency versus level characteristic which varies with time;
   first control signal generating means for generating a control signal which undergoes level variation in correspondence with the variation in said characteristic of the input musical tone signal supplied from said supplying means;
   first frequency signal producing means supplied with the control signal generated from said first control signal generating means, for producing a frequency signal which varies its frequency according to the level of said control signal;
   analog-to-digital (A/D) converting means for sampling the input musical tone signal supplied from said supplying means according to the frequency signal from said first frequency signal producing means, and converting the input musical tone signal into a digital signal; and
   a memory into which the output digital signal of said A/D converting means is stored according to the frequency signal from said first frequency signal producing means.

2. A storing system as claimed in claim 1 which further comprises envelope control means for controlling an envelope of the input musical tone signal supplied from said supplying means according to the control signal from said first control signal generating means, so that the envelope of the input musical tone signal becomes substantially constant.

3. A storing system as claimed in claim 1 which further comprises variable lowpass filter means supplied with the input musical tone signal from said supplying means, wherein said variable lowpass filter means is varied of its cutoff frequency according to the control signal from said first control signal generating means.

4. A storing system as claimed in claim 2 which further comprises variable lowpass filter means supplied with an output musical tone signal of said envelope control means, wherein said variable lowpass filter means is varied of its cutoff frequency according to the control signal from said first control signal generating means.

5. A storing system as claimed in claim 1 in which said first frequency signal producing means is a voltage-to-frequency converting means which converts the control signal from said first control signal generating means into a signal having a frequency in accordance with the voltage of said control signal.

6. A storing system as claimed in claim 1 in which said input musical tone signal is a signal having a characteristic such that its high frequency range components becomes attenuated rapidly compared to its low frequency range component after a rising-up in said input musical tone signal, said first control signal generating means generates a control signal which gradually becomes attenuated of its level after a rising-up in said control signal, and said first frequency signal producing means produces a frequency signal which gradually decreases in its frequency after a rising-up in said frequency signal.

7. A storing system as claimed in claim 1 which further comprises first rising-up detecting means for detecting a rising-up in the input musical tone signal supplied from said supplying means, and supplying an output detection signal to said first control signal generating means.

8. A system for reading out and reproducing a digital signal from a memory which is stored with said digital signal according to said storing system claimed in claim 1, said read-out system comprising:
   voltage supplying means for supplying a voltage;
   second control signal generating means for generating a control signal which undergoes the same level variation as the control signal generated by said first control signal generating means, when supplied with the voltage from said voltage supplying means;
   second frequency signal producing means supplied with the control signal generated from said second control signal generating means, for producing a frequency signal which varies its level according to the level of said control signal from said second control signal generating means, the output frequency signal of said second frequency signal producing means undergoing the same frequency variation as the output frequency signal produced by said first frequency signal producing means;
   read-out means for reading out the stored digital signal from said memory according to the output frequency signal of said second frequency signal producing means;

digital-to-analog (D/A) converting means for converting the digital signal read out by said read-out means into an analog signal according to the output frequency signal of said second frequency signal producing means; and means for obtaining the output of said D/A converting means as a reproduced musical tone signal.

9. A read-out system as claimed in claim 8 wherein said storing system further comprises first envelope control means for controlling an envelope of the input musical tone signal supplied from said supplying means according to the control signal from said first control signal generating means so that the envelope of the input musical tone signal becomes substantially constant, and said read-out system further comprises second envelope control means for controlling an envelope of the output signal of said D/A converting means according to the control signal from said second control signal generating means so that the envelope of the output signal of the D/A converting means becomes the same as the envelope of the input musical tone signal in said storing system.

10. A read-out system as claimed in claim 8 wherein said storing system further comprises first variable lowpass filter means supplied with the input musical tone signal from said supplying means, said first variable lowpass filter means being varied of its cutoff frequency according to the control signal from said first control signal generating means, and said read-out system further comprises second variable lowpass filter means supplied with the output signal of said D/A converting means, said second variable lowpass filter means also being varied of its cutoff frequency according to the control signal from said second control signal generating means as said first variable lowpass filter means.

11. A read-out system as claimed in claim 8 wherein said storing system further comprises first envelope control means for controlling an envelope of the input musical tone signal supplied from said supplying means according to the control signal from said first control signal generating means so that the envelope of the input musical tone signal becomes substantially constant, and first variable lowpass filter means supplied with the output musical tone signal of said first envelope control means, said first variable lowpass filter means being varied of its cutoff frequency according to the control signal from said first control signal generating means, and said read-out system further comprises second variable lowpass filter means supplied with the output signal of said D/A converting means, said second variable lowpass filter means also being varied of its cutoff frequency according to the control signal from said second control signal generating means as said first variable lowpass filter means, and second envelope control means for controlling an envelope of the output signal of said second variable lowpass filter means according to the control signal from said second control signal generating means so that the envelope of the output signal of the second variable lowpass filter means becomes the same as the envelope of the input musical tone signal in said storing system.

12. A read-out system as claimed in claim 8 in which said second frequency signal producing means comprises a voltage-to-frequency converting means which converts the control signal from said second control signal generating means into a signal having a frequency in accordance with the voltage of said control signal from said second control signal generating means.

13. A read-out system as claimed in claim 8 which further comprises second rising-up detecting means for detecting a rising-up in the voltage supplied from said voltage supplying means, and supplying an output detection signal to said second control signal generating means.

14. A system for storing and reading out a musical tone signal, said system comprising:

supplying means for supplying an input musical tone signal having a frequency versus level characteristic which varies with time;

control signal generating means for generating a control signal which undergoes level variation in correspondence with the variation in said characteristic of the input musical tone signal supplied from said supplying means during a storing mode;

frequency signal producing means supplied with the control signal generated from said control signal generating means, for producing a frequency signal which varies its frequency according to the level of said control signal;

analog-to-digital (A/D) converting means for sampling the input musical tone signal supplied from said supplying means according to the frequency signal from said frequency signal producing means, and converting the input musical tone signal into a digital signal;

voltage supplying means for supplying a voltage to said control signal generating means during a read-out mode, said control signal generating means generating said control signal when supplied with said voltage from said voltage supplying means;

a memory into which the output digital signal of said A/D converting means is stored according to the frequency signal from said frequency signal producing means during the storing mode, and from which the stored digital signal is read out according to the frequency signal from said frequency signal producing means during the read-out mode;

digital-to-analog (D/A) converting means for converting the digital signal read out from said memory into an analog signal according to the output frequency signal of said frequency signal producing means; and means for obtaining the output of said D/A converting means as a reproduced musical tone signal.

* * * * *